(12) United States Patent
Hellström et al.

(10) Patent No.: US 8,178,371 B2
(45) Date of Patent: May 15, 2012

(54) SOLID-STATE LASERS

(75) Inventors: Jonas Hellström, Solna (SE); Gunnar Elgcrona, Solna (SE); Kenneth Joelsson, Solna (SE)

(73) Assignee: Cobolt AB, Solna (SE)

( * ) Notice: Subject to any disclaimer, the term of this patent is extended or adjusted under 35 U.S.C. 154(b) by 0 days.

(21) Appl. No.: 13/164,084

(22) Filed: Jun. 20, 2011

(65) Prior Publication Data
US 2011/0244608 A1 Oct. 6, 2011

Related U.S. Application Data

(62) Division of application No. 12/230,523, filed on Aug. 29, 2008.

(51) Int. Cl.
*H01L 21/00* (2006.01)

(52) U.S. Cl. ............ 438/26; 438/64; 438/106; 438/118; 438/125; 257/E33.057; 257/E23.003; 257/E21.499; 257/E21.5; 257/E21.514

(58) Field of Classification Search .................... 438/26, 438/64, 106, 118, 125; 257/E33.056, E33.057, 257/E33.058, E23.003, E21.499, E21.5, E21.514; 372/34
See application file for complete search history.

(56) References Cited

U.S. PATENT DOCUMENTS

| | | | |
|---|---|---|---|
| 4,835,786 A | 5/1989 | Morris et al. | |
| 5,068,865 A | 11/1991 | Ohshima et al. | |
| 5,150,376 A | 9/1992 | Ohmori et al. | |
| 5,170,409 A | 12/1992 | Nightingale et al. | |
| 5,832,015 A | 11/1998 | Goto et al. | |
| 6,172,997 B1 | 1/2001 | Miyake et al. | |
| 6,178,188 B1 | 1/2001 | Jing et al. | |
| 6,292,499 B1 | 9/2001 | Pearson et al. | |
| 6,330,259 B1 | 12/2001 | Dahm | |
| 6,661,815 B1 | 12/2003 | Kozlovsky et al. | |
| 6,758,609 B2 | 7/2004 | Fathi et al. | |
| 6,805,492 B2 | 10/2004 | Hashimoto et al. | |
| 6,807,208 B2 | 10/2004 | Nasu et al. | |
| 6,847,660 B2 * | 1/2005 | Morikawa et al. | 372/5 |
| 6,895,027 B2 | 5/2005 | Treusch et al. | |

(Continued)

FOREIGN PATENT DOCUMENTS

EP 0 512 816 A 11/1992

(Continued)

OTHER PUBLICATIONS

Occhionero et al., "AlSiC for Optoelectronic Thermal Management and Packaging Designs," *SPIE Proceedings*, vol. 5288, pp. 495-499 (Nov. 2003).

(Continued)

*Primary Examiner* — Julio J Maldonado
(74) *Attorney, Agent, or Firm* — Buchanan Ingersoll & Rooney

(57) ABSTRACT

A method for assembling an optically pumped solid-state laser having an extended cavity. The method includes the steps of providing a casing, mounting a TEC and a base plate in the casing, and mounting a plurality of laser components on the base plate using a UV and heat curing adhesive. Once the laser components are correctly positioned and aligned on the base plate, the adhesive is pre-cured using UV radiation. Final curing of the adhesive is obtained by subjecting the entire laser package to an ambient temperature of at least 100° C. The base plate is preferably selected to have a CTE similar to that of the laser components in order to facilitate the high temperature curing. A preferred material for the base plate is AlSiC.

13 Claims, 3 Drawing Sheets

U.S. PATENT DOCUMENTS

| | | |
|---|---|---|
| 7,103,075 B2 | 9/2006 | Tojo et al. |
| 2003/0228114 A1 | 12/2003 | Fathi et al. |
| 2005/0094950 A1 | 5/2005 | Morikawa et al. |
| 2006/0034570 A1 | 2/2006 | Morikawa et al. |
| 2006/0172510 A1 | 8/2006 | Connell et al. |
| 2007/0104240 A1 | 5/2007 | Le Vaillant et al. |
| 2007/0248139 A1 | 10/2007 | Bischel et al. |
| 2008/0008217 A1 | 1/2008 | Miller |
| 2010/0054289 A1 | 3/2010 | Hellstrom et al. |

FOREIGN PATENT DOCUMENTS

| | | |
|---|---|---|
| EP | 1 022 822 A | 7/2000 |
| WO | WO 2008/069456 A | 6/2008 |

OTHER PUBLICATIONS

Occhionero et al., "Aluminum Silicon Carbide (AISiC) Microprocessor Lids and Heat Sinks for Integrated Thermal Management Solutions," IMAPS Denver 2000 HDI and Systems Packaging, (Apr. 26-28, 2000) pp. 1-5.

Occhionero et al., "Aluminum Silicon Carbide (AISiC) for Advanced Microelectronic Packages", IMAPS May 1998 Boston Meeting Ceramics Process Systems Corp., pp. 1-6.

Occhionero et al., "Aluminum Silicon Carbide (AISiC) Thermal Management Packaging for High Density Packaging Applications," IMAPS HDP and MCM's, Denver CO Apr. 6-9, 1999, pp. 1-6.

Occhionero et al., "Cost-Effective Manufacturing of Aluminum Silicon Carbide (AISiC) Electronic Packages," IMAPS Advanced Packaging Materials Symposium Mar. 14-17, 1999 Ceramic Process Systems Corp. pp. 1-7.

Pliska et al., "Bonding Semiconductor Laser Chips: Substrate Material Figure of Merit and Die Attach Layer Influence", Belgirate, Italy, Sep. 28-30, 2005, 8 pages.

International Search Report completed Dec. 2, 2009.

Written Opinion of the International Searching Authority completed Dec. 2, 2009.

\* cited by examiner

SOLID-STATE LASERS

CROSS REFERENCE TO RELATED APPLICATIONS

The present application is a divisional of U.S. application Ser. No. 12/230,523, filed on Aug. 29, 2008. The entire contents of U.S. application Ser. No. 12/230,523 are hereby incorporated herein by reference.

TECHNICAL FIELD

The present invention generally relates to improvements in or relating to optically pumped solid-state lasers. In particular, the present invention relates to improvements in or relating to solid-state lasers having extended cavities and a plurality of laser components and optical surfaces.

RELATED ART

U.S. Pat. No. 5,170,409 discloses a resonator assembly suited for a diode pumped solid-state laser. The resonator assembly comprises a transparent support plate, e.g. formed from Pyrex, having a coefficient of thermal expansion significantly lower than common metals. Mirror mounts are bonded to the support plate using a UV curable adhesive. Before curing the adhesive using UV radiation, the position of the parts can be adjusted until proper alignment is achieved. By using a support plate formed from a material with a low coefficient of thermal expansion, the stability of the laser is said to be enhanced.

U.S. Pat. No. 6,178,188 discloses a laser assembly platform with a silicon base. Features are etched in the silicon base in order to simplify alignment of laser elements during assembly. In a comparatively elaborate soldering scheme, layers of metal, alloys, solder and/or other materials are applied to the silicon base before placing the laser components at the desired positions. Such soldering process is said to be preferred over using a thermal epoxy because thermal epoxy would require heating to high levels (e.g. 85° C. for twelve hours).

U.S. Pat. No. 6,758,609 discloses joining of optically coupled optoelectronic and fiber optic components using electromagnetic radiation. It is explained therein, that thermal cure adhesives are typically more stable post-cure than UV-curable adhesives and typically result in less moisture pick-up and better mechanical properties. Unfortunately, thermal cure adhesives may require a long cure time. In contrast, UV-curable adhesives cure much faster than thermal cure adhesives. UV-curable adhesives require a line of sight for UV radiation to reach the adhesive to be cured. This is explained to be a drawback in that special design configurations of optoelectronic component assemblies may obstruct light paths and thus cause poor curing of the adhesive. To overcome these limitations of UV-curable adhesives, U.S. Pat. No. 6,758,609 proposes the use of non-ionizing radiation in the form of RF and microwave radiation, which are said to be interchangeable, for rapid curing of the adhesive.

US 2008/0008217 discloses a heat sink for a laser module, the heat sink being configured to provide a relatively low thermal resistance for thermal management of the laser. The heat sink is also configured to provide a coefficient of thermal expansion (CTE) that is substantially matched to the CTE of the laser. The heat sink comprises a substrate made out of a first material. The substrate includes via holes filled with a second material distinct from the first material of the substrate. By properly selecting the first and second materials, configuring the overall mass of the substrate with respect to the overall mass of the filled via holes, and positioning and arranging the filled via holes with respect to the laser device, a desired effective thermal resistance and CTE for the heat sink may be achieved.

In a paper by Occhionero et al., "*AlSiC for Optoelectronic Thermal Management and Packaging Designs*", SPIE Proceedings, Vol. 5288, pp. 495-499, November 2003, which is incorporated herein by reference, there is disclosed AlSiC materials and their use in optoelectronic packages. With respect to the mechanical design of optoelectronic packages, it is concluded therein that by choosing materials that have compatible CTE, mechanical stresses are reduced and overall module reliability is improved. The appropriate AlSiC material composition selection will best be determined by evaluating the CTE values of all of the materials in the optoelectronics module. Thermally induced stresses during module assembly and during module operation can be mitigated by selection of a compatible material set.

Despite the above efforts, there have been issues in the art relating to the manufacture of optically pumped solid-state lasers that limits production, long-term stability and high output powers, particularly for such lasers having an extended cavity with a plurality of laser components and optical surfaces.

SUMMARY

The inventive technology disclosed herein aims generally towards improving manufacture, performance and long-term stability of optically pumped solid-state lasers. In particular, the inventive technology aims towards advancing manufacture as well as operational performance and longevity of lasers having extended cavities, i.e. non-microchip lasers, comprising multiple elements and optical surfaces. An exemplary laser targeted by the inventive improvements disclosed herein may have a cavity length of about 10-30 mm. For such a laser, although comparatively compact, mechanical tolerances for proper operation are very demanding. Typically, components and elements in the laser should meet tolerances of about 0.1 mrad in angle and about 10 μm in translation.

One common type of optically pumped lasers is the diode pumped solid-state laser (DPSSL), which in this specification will serve as the illustrative, non-limiting example. In a basic configuration, a DPSSL comprises a pump diode laser, an optically pumpable gain medium that emits optical radiation when pumped by the diode, and a resonant cavity enclosing the gain medium.

An identified source of laser component dealignment is mechanical fatigue and stress induced by operational cycling of the laser. During the life of the laser, it undergoes a large number of operational cycles, i.e. turning the laser on and off, or varying the output power of the laser. Since operation of the laser causes temperature gradients in the laser, stresses induced by thermal expansion may eventually lead to mechanical fatigue and output power degradation. Similar stress on the laser can also be caused by thermal shock and mechanical movement during transport.

An identified source of optical surface contamination is out-gassing from adhesives used for securing laser components to the base plate of the laser. Due to manufacturing concerns, laser components are typically secured to the base plate using UV-curable adhesives. Such adhesives are convenient, because curing can be effected once all laser components have been properly positioned and aligned. Over time, however, these adhesives may out-gas contaminants that adhere to optical surfaces in the laser. Such contamination is particularly harmful for sensitive, short-wavelength quasi three-level lasers.

The inventive improvements disclosed herein proposes a combination of a thermally and UV curable adhesive and a base plate having a coefficient of thermal expansion (CTE) that is generally matched to the laser components in order to allow heat curing in an elevated temperature environment. For proper heat curing of the adhesive used for fixing the laser components, heating to a temperature of more than 100° C. must typically be effected. It is indeed a challenge to devise a laser having an extended cavity and multiple laser components and optical surfaces, which can withstand being heated as a package to above 100° C. Even temperatures as high as 150° C. may be required in some instances.

Using high temperature curing adhesives would greatly improve the robustness and ruggedness of the lasers. However, and as indicated above, the laser must be designed specifically for the purpose of being heated to such high temperatures, or else the laser would typically not be operational following the harsh high temperature treatment.

A number of measures, each of which brings an improvement facilitating high temperature treatment, are therefore suggested here. It should be noted that each of these measures can be employed in isolation for facilitating high temperature treatment, and each measure can also be combined with any other measure for further improvement.

Improvements are obtained by mounting laser components, such as optical crystals, mirrors, pump diodes, filters, thermoelectric coolers etc. on a base plate made from a material having a CTE that is generally similar to the CTE of the components mounted thereon.

For further improvement, it is also suggested that the high temperature curing of the adhesive be performed in more than one step. For a multi-step high temperature curing scheme, it is preferred to use the highest curing temperature for the first step, and then use lower curing temperatures for the or each following curing step.

Even if the CTE of the base plate and the laser components mounted thereon is matched, there may still be issues relating to temperature gradients within the package unless dimensions of for example the base plate are properly selected.

BRIEF DESCRIPTION OF THE DRAWINGS

In the detailed description below, reference is made to the accompanying drawings, on which.

DETAILED DESCRIPTION

Figure 1:
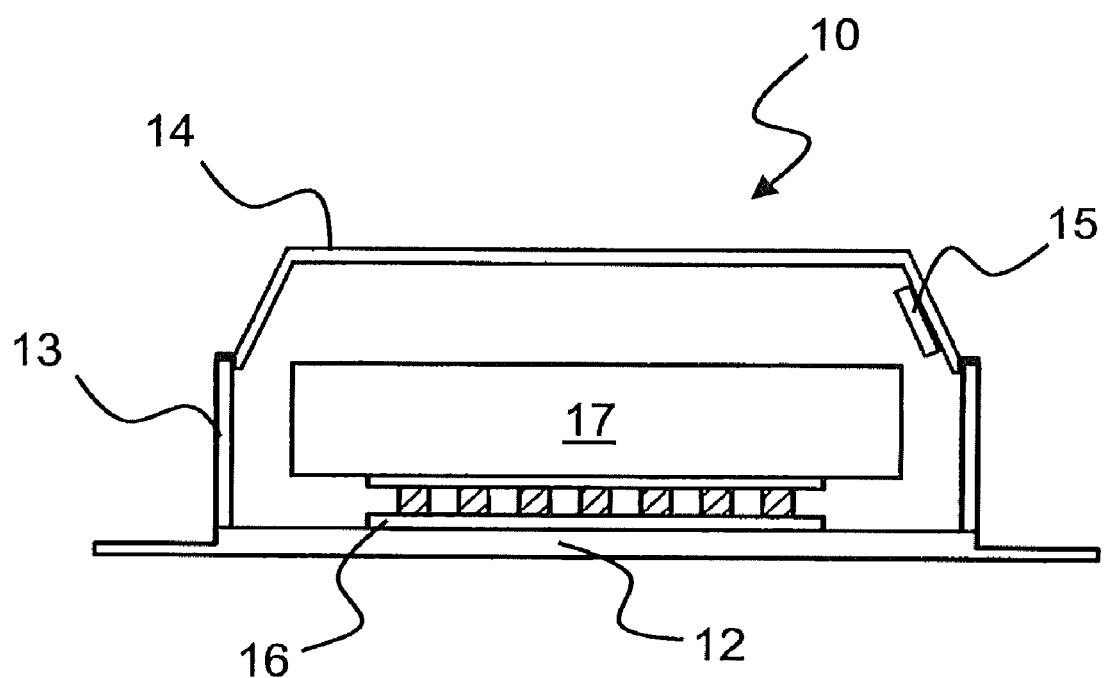
FIG. 1 schematically shows a simplified sectional side view of an exemplary solid-state laser assembly.

Embodiments provide a new scheme for attaching laser components to a base plate using both pre-curing by actinic radiation, such as ultraviolet radiation, and final curing by heat treatment. This new scheme enables greatly improved specification parameters to be met in terms of operation/storage temperatures, shock and vibration, humidity, power stability, lifetime, and dynamic pointing stability.

In the detailed description below, reference is made to diode pumped solid-state lasers as an illustrative, non-limiting example. However, it should be understood that the inventive contributions disclosed herein can be applied to any solid-state laser having an extended cavity and a plurality of elements and optical surfaces.

Components and materials used in assembling a DPSSL are selected such that the CTE thereof is substantially matched. This alleviates many of the previous problems relating to tension building up in glue joints during temperature changes. It has been identified that high tension in joints could otherwise lead to cracks, which in turn may lead to components moving or falling off the base plate, ultimately causing laser output power failure.

The idea of CTE matching also allows the use of a new class of adhesives for securing components to the base plate. The most attractive adhesives available require thermal curing at high temperatures. However, for traditional DPSSLs having a base plate of aluminum, brass or similar, the thermal expansion that would ensue from high temperature thermal curing would cause movement of the laser component in relation to the base plate, and also high tension in glue joints after the adhesive has cured and the device has cooled down. By using CTE matching, an entire laser package can be subjected to temperatures above 100° C. and even up to 150° C. without significant deterioration due to any of the above-mentioned problems.

The process for securing the laser components to the base plate can briefly be summarized as follows. First the adhesive is partially cured using actinic radiation, such as ultraviolet (UV) light. Although the joints are not entirely solid, such pre-curing will fix the position and orientation of the components relative to each other and the base plate. The pre-curing of the adhesive provides a very precise positioning of the laser components on the base plate. After the adhesive has been pre-cured using UV radiation, a final curing step is performed in which the entire package is subjected to an ambient temperature typically between 100° C. and 150° C. to bake out and fully cure the adhesive.

The possibility to use high temperature curing adhesives also opens up for another attractive advantage, since such adhesives typically have a very low out-gassing of constituents. Traditional adhesives used for DPSSLs have a tendency to out-gas constituents during the life of the laser, which leads to degradation, particularly for short wavelength lasers, due to contamination of optical surfaces. Avoiding such out-gassing will maintain high performance for a prolonged period of time compared to traditional lasers.

An exemplary DPSSL comprises an outer casing for environmental protection. Within the outer casing, the actual laser components are mounted. The laser components are mounted on a base plate, and the base plate is secured within the outer casing. In order to provide overall temperature control, the base plate is secured to the outer casing by an intermediate thermo-electric cooler (TEC). The TEC is used for removing excess heat from the base plate for dissipation through the casing.

A preferred adhesive for mounting laser components on the base plate is EPO-TEK® OG198-50, available from EPOXY TECHNOLOGY, Inc., Billerica, Mass. This adhesive is a UV/heat cure epoxy for optical applications having excellent thermal cycling properties and high shear strength. The adhesive can be pre-cured using 100 mW/cm$^2$ of light at 300-400 nm. To fully cure the adhesive, it is subjected to an elevated ambient temperature of 150° C. for 30 min., or 120° C. for 60 min.

A preferred class of materials for the CTE matched base plate is Aluminum Silicon Carbide (AlSiC). AlSiC has a CTE that can be varied from about 6 ppm/K to about 12 ppm/K, depending on the Al content. AlSiC also exhibits an attractive thermal conductivity of more than 150 W/mK at typical operational temperatures, and a density of about 3 g/cm³. Known or future materials of similar characteristics can also be used.

The combination of high performance adhesives that are heat curable, and a base plate made from such material brings about a number of advantages. For example, the low density of the AlSiC base plate leads to a comparatively low inertia of the base plate, which in turn improves the shock resistance of the laser device. Nevertheless, there is some trade off between shock resistance and thermal management for the base plate. If the base plate is very thin, then the shock resistance of the laser package is excellent since only a small inertial mass will be present. However, a thin base plate is not as mechanically stable as a thicker base plate. As a guideline for the required shock resistance, the laser package should be able to withstand an impact of 60 g during 8 ms. In general, the density of the base plate material should preferably be less than about 5 g/cm³.

The inventors of the present technology have made experiments using a base plate of AlSiC that was 2 mm thick. This base plate was attached to (the cold side of) a TEC that covered a large portion of the face of the base plate. The TEC was, in turn, attached to the bottom of an outer casing made from Kovar®. Kovar®, which per se is well known in the art, is an iron-nickel-cobalt alloy with a CTE of about 5 ppm/K for temperatures up to about 400° C. When this package was subjected to the high temperature curing for fixing laser components to the base plate, thermal gradients in the base plate caused severe bending that resulted in a laser that was not operational following the high temperature treatment. Tests were made using gradually increasing thickness for the base plate, and it was then found that a minimum thickness for the base plate is about 6 mm. Most preferably, the thickness of the base plate is about 8 mm. Thicker base plates can also be used, such as 10 mm, but eventually inertia becomes significant such that the shock resistance of the laser package is limited. Excess inertia in the base plate may lead to failure as a result of shock wherein the TEC connecting the base plate to the casing simply breaks due to the inertial forces generated. For practical applications, the base plate should not be thicker than about 20 mm, and preferably not thicker than about 15 mm.

FIG. 1 schematically shows a sectional side view of an exemplary embodiment of a DPSSL package 10. The DPSSL package comprises an outer casing having a bottom portion 12, one or more wall portions 13, and a lid portion 14. Although not shown explicitly in FIG. 1, it is preferred to have the bottom portion 12 and the wall portions 13 made in one piece. As can be seen from the Figure, the lid portion 14 is beveled around its upper circumference. On one of the beveled sides of the lid portion 14, there is provided an output aperture 15 for the generated laser beam. In the exemplary embodiment, the outer casing is made from Kovar®. Within the outer casing, there is provided a thermoelectric cooler (TEC) 16, upon which a base plate 17 is attached. On the base plate 17, the operational laser components are mounted. In order not to overly complicate the drawing, such laser components are not shown in FIG. 1. The DPSSL package further comprises electrical connections, which are also not shown in FIG. 1 for reasons of illustrative clarity.

The TEC 16 is used, during operation of the laser, for removing heat from the base plate 17 and to dissipate such heat into the bottom portion 12 of the outer casing. As can be understood when studying FIG. 1, the TEC will experience high forces when the laser package is subjected to shock. If the inertia of the base plate 17 is too high, then the TEC may break, leading to complete laser failure. Therefore, the thickness of the base plate is carefully selected in view of thermal management as well as mechanical shock resistance. In the exemplary embodiment, the thickness of the base plate 17 is 8 mm. The laser package would typically still have satisfactory performance for a thinner base plate of 6 mm thickness, or a thicker base plate of 10 or 15 mm thickness, but experiments have shown that 8 mm is preferred for a base plate material such as AlSiC. Generally, a large contact surface area between the base plate 17 and the TEC 16 facilitates the use of thicker base plates, and vice versa.

It has also been found that thermal expansion management is improved when using quadratic, rather than rectangular, TECs and base plates. Thus, it is generally preferred to use a base plate 17 and a TEC 16 that are generally quadratic in shape.

The preferred material for the base plate is AlSiC. From a purely thermal management and thermal expansion point of view, however, also other materials could a priori seem attractive, such as CuW or Kovar®. However, experiments have shown that CuW and Kovar® have a density that is simply too high in order to achieve acceptable shock resistance.

As described above, the TEC 16 is operative to remove excess heat from the base plate 17 and to dissipate this heat through the bottom portion 12 of the outer casing. In order to prevent large temperature gradients in the bottom portion 12, the thickness of the bottom portion 12 should be limited to a few millimeters. In the exemplary embodiment illustrated in FIG. 1, the bottom portion 12 of the outer casing has a thickness of 2 mm. For operation, the entire laser package should be mounted to a structure, e.g. using mounting feet 204 (see FIG. 2), for receiving the heat dissipated through the bottom portion 12.

Figure 2:
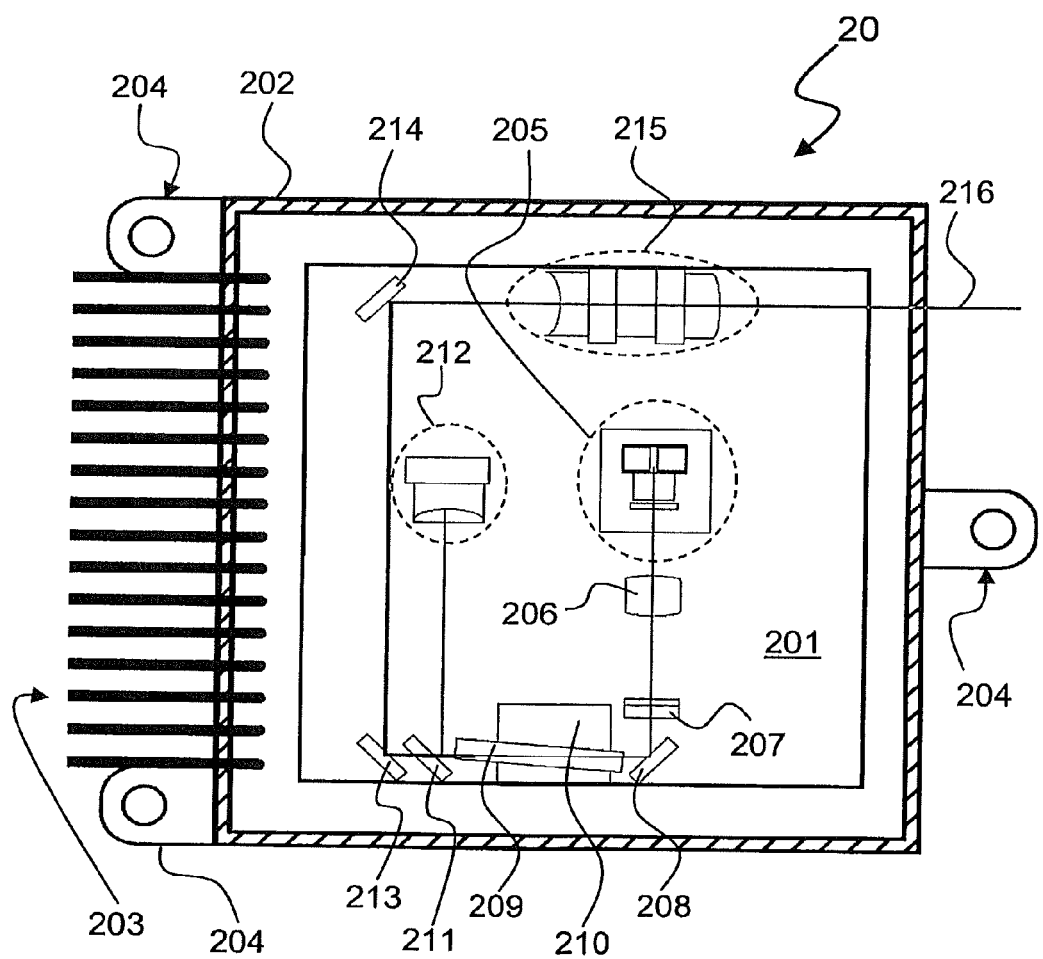
FIG. 2 schematically shows a top view of an exemplary solid-state laser assembly.

FIG. 2 schematically shows a top view of an embodiment of a DPSSL package 20. The DPSSL package shown in FIG. 2 may correspond to DPSSL package 10 shown in FIG. 1. The package 20 has an outer casing with side walls 202, which may correspond to the wall portions 13 shown in FIG. 1. Inside the package 20, there is provided a base plate 201. The base plate is preferably made from AlSiC, and may correspond to the base plate 17 shown in FIG. 1. The package 20 also comprises connection pins 203 for connection of the DPSSL package 20 to an external controller, as well as package mounting feet 204 for securing the package 20 to a mounting structure. Although not explicitly shown in FIG. 2 in order not to overly complicate the drawing, it should be understood that a plurality of the connection pins 203 are electrically connected to corresponding components in the DPSSL package 20. On the base plate 201, laser components for the DPSSL are mounted. A pump diode unit 205 is provided for optical pumping. The pump diode unit 205 may also, in some embodiments, be mounted on a TEC, which in turn is attached to the base plate 201. Optical pumping radiation emitted by the pump diode unit 205 is conditioned by pump beam optics 206 and then incident into a laser crystal 207. Directly upon the face of the laser crystal 207, a first cavity mirror is provided, and the pumping radiation enters the laser crystal 207 through this first cavity mirror. Upon optical pumping, the laser crystal 207 emits fundamental laser radiation, which is directed by a second cavity mirror 208 towards a non-linear element 209. The non-linear element 209 is mounted on a dedicated TEC 210 in order to control the temperature of non-linear element 209. In the non-linear element 209, a portion of the fundamental laser radiation is converted into frequency converted radiation, and remaining fundamental laser radiation is directed by way of a third cavity mirror 211 towards a fourth cavity mirror assembly 212. Frequency converted radiation passes through the third cavity mirror 211 towards beam steering optics 213 and 214 to exit the DPSSL package 20 in the form of laser beam output at 216. Before the laser beam is output at 216, it passes a telescope unit 215 for forming the laser beam to a desired spatial profile.

The base plate 201 is mounted on a TEC in the same manner as shown for base plate 17 and TEC 16 in FIG. 1, in order to control the overall temperature of the base plate 201.

Typical dimensions of the DPSSL package 20 are a few tens of millimeters. For example, the footprint of the outer casing may be 50 mm×50 mm. Compared to, for example, a standard diode laser, the dimensions are rather large. This means that the DPSSL package 20 is quite sensitive to relative movement between the individual laser components. For this reason, it is here proposed to use an inventive type of assembly in order to minimize such relative movement between individual laser components.

The laser components mounted on the upper side of base plate 201 are secured by means of an adhesive that is both UV and heat curable. The process for securing the laser components to the base plate includes applying a UV/heat curable adhesive to the base plate 201; positioning any desired laser components on the base plate 201 in contact with the adhesive; aligning the laser components to form an operational DPSSL; pre-curing the adhesive by exposing the adhesive to UV radiation; and heat curing the adhesive by placing the entire base plate (or even the entire package) with the laser components in an oven at an elevated ambient temperature to fully cure the adhesive. The final heat curing step is typically performed at ambient temperatures of above 100° C., such as 120° C. or 150° C. For any previously known DPSSL, such temperatures would severely degrade laser performance due to relative movement of the laser components caused by differential thermal expansion of the individual parts, as well as temperature gradients within the package. Therefore, it is here proposed to use a material for the base plate 201 that has a coefficient of thermal expansion (CTE) that is similar to the laser components mounted on the base plate. A particularly suitable material for the base plate is, as mentioned above, AlSiC. The combination of using a CTE matched base plate and a UV/heat curable adhesive is a particularly attractive feature of this invention.

It may be preferred to employ a multi-step curing process during assembly of the laser package.

For example, referring again to FIG. 1, the base plate 17, the TEC 16 and the outer casing 12 (typically having integral side walls 13) are assembled in a first curing step. For attaching the TEC 16 to the base plate 17 and to the bottom 12 of the outer casing, it is preferred to use a thermally conductive adhesive. One preferred adhesive for this purpose is EPO-TEK® H77, available from EPDXY TECHNOLOGY, Inc., Billerica, Mass. For curing the adhesive, the package is subjected to an ambient temperature of 150° C. for about 1 h.

In a second step, laser components are mounted on the base plate using an optical adhesive that is both UV and heat curing. As mentioned above, a preferred adhesive for mounting laser components to the base plate is EPO-TEK® OG198-50. Once the laser components have been properly positioned and aligned on the base plate and in contact with the adhesive, the position and orientation of the laser components are fixed by pre-curing the adhesive using UV radiation. Then the second heat curing step is performed by subjecting the entire laser package to an ambient temperature of 120° C. for about 1 h.

For the exemplary embodiment shown in the drawings, there is actually also a final curing step in connection with welding the lid 14 to the side walls 13. In order to expel moisture from the package before sealing, the entire package is heated to 105° C. Although the primary motivation for raising the temperature during welding of the lid is to remove moisture from the laser package, it has the beneficial side effect to bring about some degree of post-curing of the adhesives used for assembling the package. Although not required in order to achieve the advantages of the present invention, it is preferred to seal the laser package in a nitrogen atmosphere in order to avoid aggressive oxygen within the sealed laser package and to prevent contamination e.g. particles and gases from entering the package.

In the second step described above for mounting laser components to the base plate, it is sometimes advantageous to perform several sub-steps. For example, all cavity elements except one cavity end mirror may be mounted in the first sub-step. The final cavity mirror can then be carefully positioned and aligned, and ultimately fixed in a second sub-step. Similar to the first sub-step, the final cavity mirror is positioned and aligned before pre-curing the adhesive using UV radiation, and then fully cured by subjecting the entire laser package to an ambient temperature of 120° C. for about 1 h.

Figure 3:
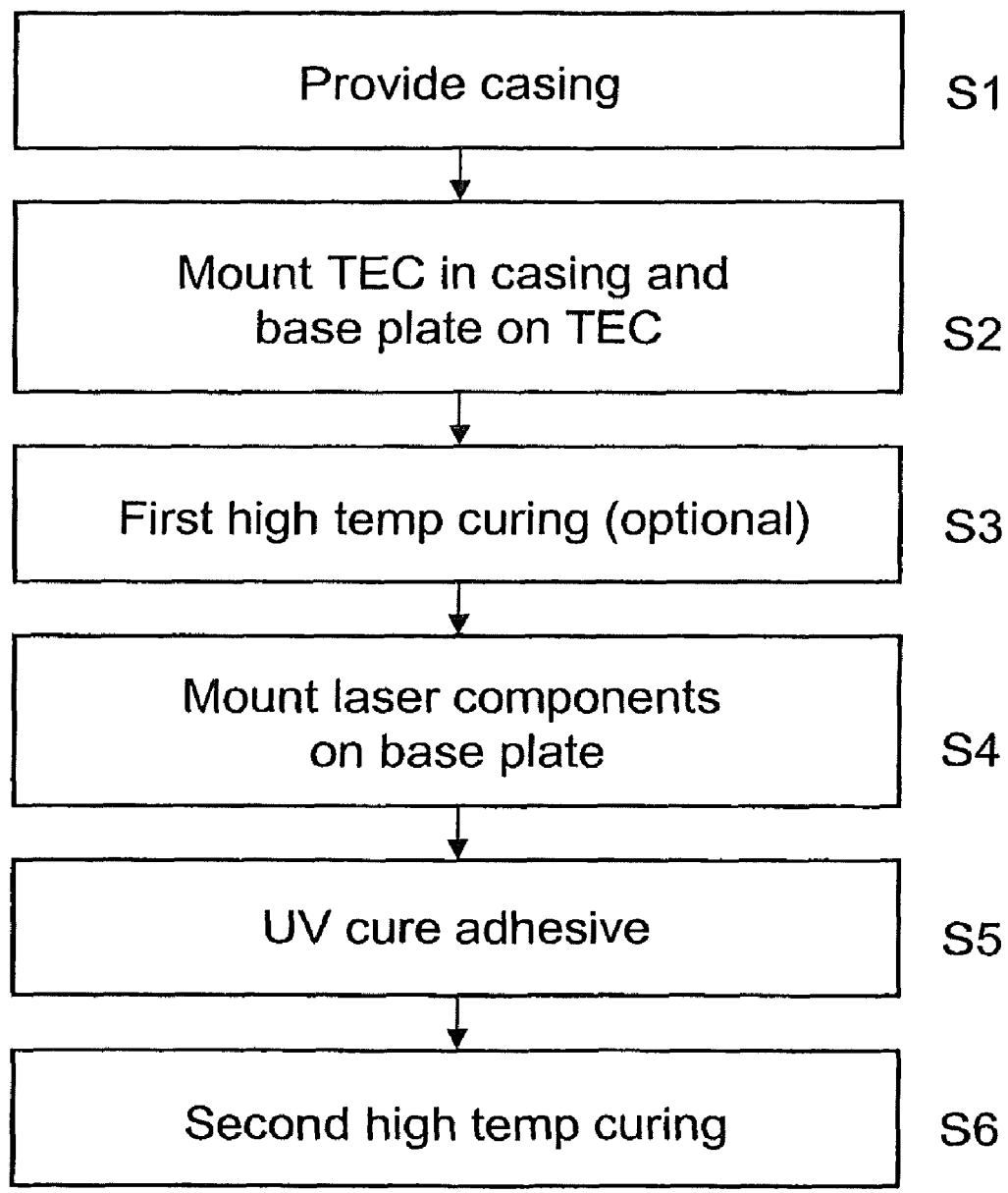
FIG. 3 outlines the inventive method for assembling a solid-state laser.

In order to outline the method for assembling an optically pumped solid-state laser according to the present invention, reference is made to FIG. 3.

In a first step S1, an outer casing is provided. The outer casing (cf. also FIG. 1) is preferably made from Kovar® and has a bottom surface and side walls made from one piece. As described above, the bottom of the outer casing preferably has a thickness of about 2 mm, in order to be sufficiently thin to avoid excess temperature gradients therein when heat is removed from the laser package and into a substructure upon which the laser package is installed. In order to improve mechanical integrity of the casing under thermal stress induced by heating, the footprint of the casing is preferably quadratic in shape.

In a second step S2, a primary TEC is mounted in the casing and a base plate is mounted on said TEC. The primary TEC has the purpose of keeping the base plate at a desired operational temperature during use of the laser. In almost all situations, this means that heat should be removed from the base plate, and therefore the primary TEC is mounted with its cool side towards the base plate and its hot side towards the bottom of the outer casing. For fixing the base plate to the TEC and the TEC to the casing, a thermally conductive adhesive is used. The base plate is made from a material that has similar coefficient of thermal expansion (CTE) as the laser components that should be mounted on the base plate. In general, it is preferred to have a base plate made from a material having a CTE between 5 and 12 ppm/K for temperatures up to about 150° C. (typical curing temperature for the thermally conductive adhesive). For practical reasons, the thermal conductivity of the base plate should preferably be at least 50 W/mK. Moreover, in order to provide good shock resistance for the laser package, and in particular to avoid failure during shock due to breakage of the primary TEC induced by inertial forces, the base plate is preferably made from a material having a density of less than about 5 g/cm$^3$ and has preferably a thickness in the range 6-15 mm (preferably about 8 mm). A particularly suitable material that fulfils the above preferred characteristics is AlSiC. One example of a suitable thermally conductive adhesive is EPO-TEK® H77 mentioned above.

The thermally conductive adhesive used for fixing the base plate to the TEC and the TEC to the casing may now optionally be cured in a first high temperature curing step S3. This optional curing of the thermally conductive adhesive can be performed, for example, by subjecting the casing, the primary TEC and the base plate to an ambient temperature of about 150° C. for about 1 h.

Once the base plate and the primary TEC have been mounted in the outer casing, with or without the optional first curing step S3, a plurality of laser components are mounted on the base plate to form a resonant cavity for the laser. The laser components are fixed to the base plate using a UV and heat curing adhesive. Once the laser components are positioned and aligned on the base plate, the UV and heat curing adhesive is pre-cured using ultraviolet radiation in step S5 in order to fix the position and orientation of the laser components. A suitable UV and heat curing adhesive for fixing the laser components to the base plate is the above-mentioned EPO-TEK® OG198-50.

Once the laser components have been fixed in position and orientation by UV curing the adhesive, the entire laser package is subjected to a second high temperature curing step S6 in order to fully bake out the adhesive. If the optional first curing step S3 was used, then the second curing step can be performed by subjecting the laser package to an ambient temperature of about 120° C. for about 1 h. If the first, optional curing step S3 was not used, then this latter curing is preferably performed at a slightly higher temperature (e.g. 150° C.) and/or for a longer period of time (e.g. 2 h.).

It is also possible to, in a first instance of step S4, mount fewer than all required laser components on the base plate and then iterate steps S4-S6 until all required laser components have been attached to the base plate. For example, it may be advantageous to position all required laser components except for one cavity mirror during the first instance of step S4, and then carefully position and align this final mirror in an iteration of steps S4-S6.

Once all desired components and connections have been provided in the laser package according to the above, the laser package is typically sealed by welding a lid to the upper side of the outer casing side walls Although the invention has been described above with reference to drawings and preferred embodiments, it should be understood that various modifications are possible without departing from the spirit and the scope of the invention as defined by the claims.

The invention claimed is:

1. A method for assembling an optically pumped solid-state laser, comprising the steps of:
   providing a casing;
   mounting a base plate for laser components in said casing;
   mounting a plurality of laser components on said base plate using an adhesive that is both ultraviolet (UV) and heat curable, at least some of said laser components forming a resonant cavity for the solid-state laser; and
   pre-curing said adhesive using UV light in order to fix position and orientation of said components on said base plate; and
   following said pre-curing, subjecting said casing, said base plate and said laser components to an ambient temperature of at least 100° C. in a heat curing step in order to cure said adhesive.

2. The method of claim 1, wherein the heat curing step is performed at an ambient temperature of at least 120° C.

3. The method of claim 1, wherein a thermally conductive adhesive is used for mounting a thermo-electric cooler (TEC) to said casing and for mounting said base plate in said casing, and wherein said thermally conductive adhesive is cured in a first heat curing step before said laser components are mounted on said base plate, said first heat curing step being performed by subjecting the casing, the TEC and the base plate to an ambient temperature of at least 120° C.

4. The method of claim 3, wherein the first heat curing step for curing the thermally conductive adhesive is performed at an ambient temperature of about 150° C.

5. The method of claim 1, wherein said base plate has a coefficient of thermal expansion between 5 and 12 ppm/K for temperatures up to about 150° C. and a thermal conductivity of at least 50 W/mK.

6. The method of claim 1, wherein the base plate is made from a material having a density of less than 5 g/cm$^3$.

7. The method of claim 1, wherein the base plate is made from AlSiC, and has a thickness in the range from about 6 mm to about 15 mm.

8. The method of claim 1, wherein the base plate is made from AlSiC, and has a thickness of about 8 mm.

9. The method of claim 1, wherein the resonant cavity of the solid-state laser has an optical path length of 10-30 mm.

10. The method of claim 1, performed in several sub-steps; comprising
    a first sub-step in which a number of laser components less than that required to form a complete resonant cavity for the solid-state laser is mounted; and
    a second sub-step in which the or each remaining laser component required to form a complete resonant cavity for the solid-state laser is mounted;
    wherein, in the second sub-step, the or each laser component remaining after the first sub-step to form a complete resonant cavity for the solid-state laser is positioned and aligned with respect to the components mounted in the first sub-step and then pre-cured using ultraviolet radiation before being fully cured by subjecting the entire laser assembly to an ambient temperature of at least 100° C.

11. The method of claim 10, wherein all cavity mirrors except one are mounted in the first sub-step, and the remaining cavity mirror is mounted in the second sub-step.

12. A method for assembling a diode pumped solid-state laser, comprising the steps of:
    providing a casing;
    mounting a base plate made from Aluminum Silicon Carbide (AlSiC) to said casing;
    applying a thermally curable adhesive to said base plate;
    positioning and aligning a plurality of laser components on said base plate in contact with said adhesive to form a diode pumped solid-state laser;
    pre-curing said adhesive, once said laser components have been positioned and aligned, by exposing said adhesive to ultraviolet radiation; and, following said pre-curing, thermally curing said adhesive by subjecting said casing, said base plate, said adhesive and said laser components to an ambient temperature of at least 100° C.

13. The method of claim 12, wherein the adhesive is thermally cured by subjecting the casing, the base plate, the adhesive and the laser components to an ambient temperature of about 120° C.

* * * * *